(12) United States Patent
Cho et al.

(10) Patent No.: US 7,105,917 B2
(45) Date of Patent: Sep. 12, 2006

(54) SEMICONDUCTOR DEVICE HAVING A FUSE CONNECTED TO A PAD AND FABRICATION METHOD THEREOF

(75) Inventors: Kang-Sik Cho, Kyunggi-do (KR); Chul-Sung Park, Seoul (KR); Gyu-Chul Kim, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 09/952,645

(22) Filed: Sep. 13, 2001

(65) Prior Publication Data

US 2002/0135055 A1 Sep. 26, 2002

(30) Foreign Application Priority Data

Mar. 23, 2001 (KR) ................ 2001-15147

(51) Int. Cl.
*H01L 23/02* (2006.01)
(52) U.S. Cl. .............. 257/678; 257/529; 257/209; 257/665; 257/48; 257/530; 257/737; 257/786; 365/200; 365/230.03; 324/517; 324/527
(58) Field of Classification Search ........... 257/665, 257/209, 529, 678, 48, 530, 737, 786; 365/200, 365/230.03; 324/517, 527
See application file for complete search history.

(56) References Cited

U.S. PATENT DOCUMENTS

| | | | | |
|---|---|---|---|---|
| 4,368,523 A | * | 1/1983 | Kawate ................ 365/63 |
| 5,355,340 A | * | 10/1994 | Coker et al. ............ 365/200 |
| 5,366,906 A | * | 11/1994 | Wojnarowski et al. ..... 438/17 |
| 5,530,278 A | * | 6/1996 | Jedicka et al. ............ 257/432 |
| 5,565,767 A | * | 10/1996 | Yoshimizu et al. ........ 324/158.1 |
| 5,736,433 A | * | 4/1998 | Bryant et al. ............ 438/130 |
| 6,028,348 A | * | 2/2000 | Hill .................... 257/666 |
| 6,118,138 A | * | 9/2000 | Farnworth et al. ........ 257/48 |
| 6,133,054 A | * | 10/2000 | Henson ................ 438/17 |
| 6,215,181 B1 | * | 4/2001 | Akram et al. ............ 257/723 |
| 6,353,336 B1 | * | 3/2002 | Lindley et al. .......... 326/83 |
| 6,373,143 B1 | * | 4/2002 | Bell .................... 257/786 |

(Continued)

FOREIGN PATENT DOCUMENTS

JP 2000-124279 4/2000

(Continued)

OTHER PUBLICATIONS

Vandevelde, et al. Improved Thermal Fatigue Reliability for Flip Chip Assemblies Using Redistribution Techniques May 2, 2000 pp. 239-246.

(Continued)

*Primary Examiner*—Eddie C. Lee
*Assistant Examiner*—Junghwa Im
(74) *Attorney, Agent, or Firm*—Marger Johnson & McCollom, P.C.

(57) ABSTRACT

A semiconductor device and a fabrication method thereof are provided. The semiconductor device has a probing pad formed on a chip. The probing pad is connected to an output pad and an internal circuit though a fuse. After an electrical testing of the chip by the probing pad, the fuse is cut by a laser beam. Therefore, the probing pad is disconnected from the output pad and the internal circuit. The output pad is connected to an output lead of a package, which is encapsulating the chip. According to the device and the fabrication methods thereof, performance of the device can be enhanced by a low parasitic capacitance and a low parasitic resistance.

6 Claims, 6 Drawing Sheets

U.S. PATENT DOCUMENTS 6,440,833 B1 * 8/2002 Lee et al. .................. 438/601
6,506,634 B1 * 1/2003 Kohyama .................. 438/132
6,562,674 B1 * 5/2003 Tsuura ....................... 438/215

FOREIGN PATENT DOCUMENTS

KR      P1999-0057745      7/1999

OTHER PUBLICATIONS

Patent Abstract of Japan, Patent No. 2000-124279.

English language Abstract of Korean Patent Publication No. P1999-0057745, published Jul. 15, 1999.

* cited by examiner

Fig. 1

(Prior Art)

SEMICONDUCTOR DEVICE HAVING A FUSE CONNECTED TO A PAD AND FABRICATION METHOD THEREOF

This application relies for priority upon Korean Patent Application No. 2001-15147, filed on Mar. 23, 2001, the contents of which are herein incorporated by reference in their entirety.

FIELD OF THE INVENTION

The present invention relates to semiconductor devices and fabrication methods thereof and, more particularly, to semiconductor devices having a fuse connected to a pad and fabrication methods thereof.

BACKGROUND OF THE INVENTION

Generally, a semiconductor device consists of a semiconductor chip and a package encapsulating the chip. The semiconductor chip comprises a plurality of conductive pads. The pads are generally located at a peripheral area, i.e., close to the edge of the chip. The pads are used for an electrical testing of the chip during its fabrication process. Generally, a plurality of the chips is fabricated simultaneously on a semiconductor wafer. The electrical testing is performed to sort out defective chips among the plurality of the chips.

Meanwhile, the pads are also used for a packaging process. The pads are electrically connected to outputs of the semiconductor device during the packaging process. For example, each of the pads is connected to a corresponding one of output leads of the package through conductive wires.

Generally, each of the pads is used for both the electrical testing and the packaging process. In this case, it is difficult to bond the wires on the pads. This is due to damage on the pad. During the electrical testing, probing tips are physically contacted to the pads. This physical contacting induces the damage on the pads.

Figure 1:
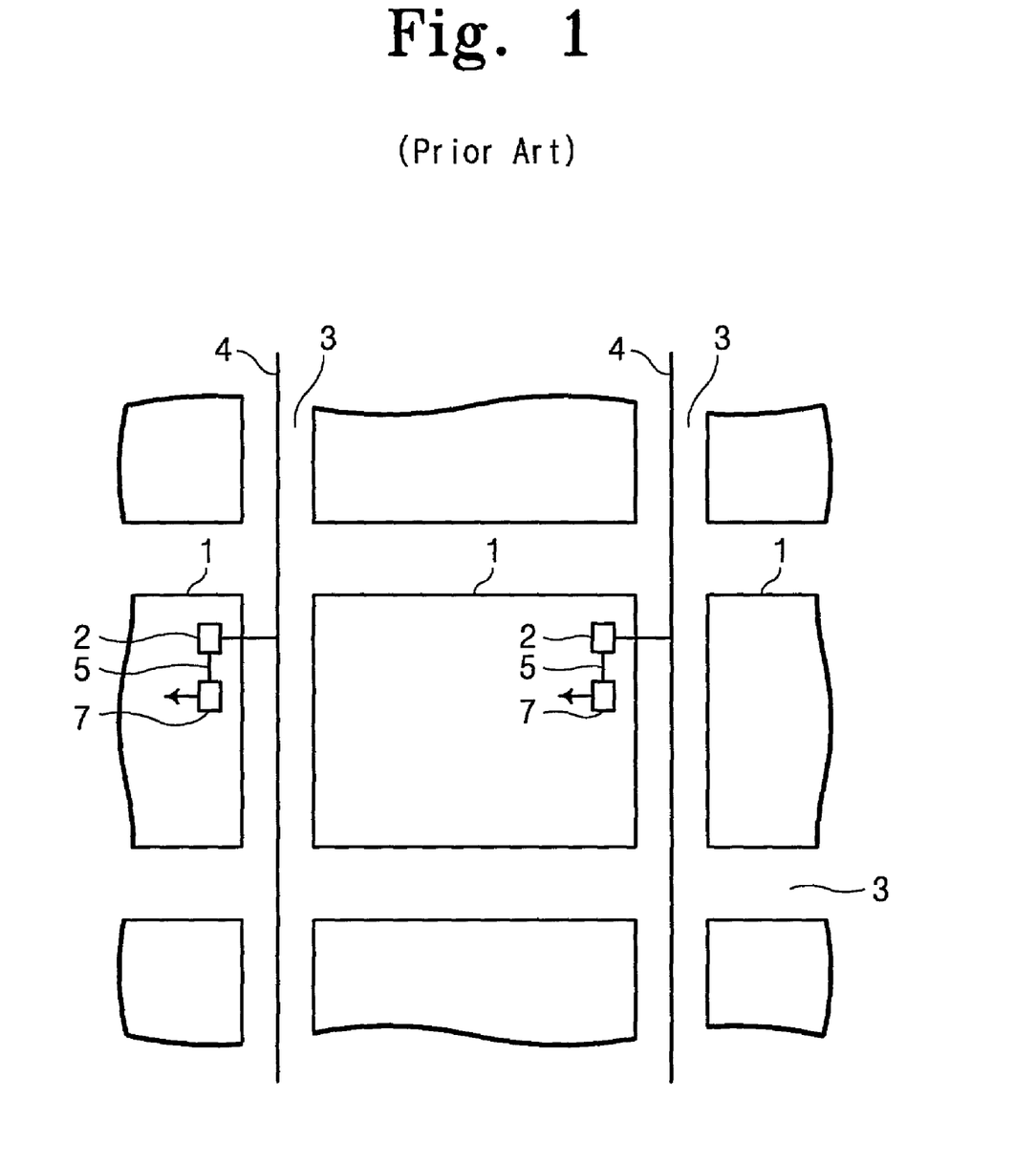
FIG. 1 is a plan view illustrating semiconductor devices according to a prior art.

A semiconductor wafer, which is useful for a wafer-level burn-in testing, is disclosed in a document, Japanese laid-open patent No. 2000-124279. FIG. 1 is a plan view of the wafer disclosed in the Japanese document.

Referring to FIG. 1, a plurality of semiconductor chips 1 is arranged on a wafer. Scribe lanes 3 intervene between each of the plurality of semiconductor chips 1. A burn-in power line 4 is formed on the scribe lanes 3. The burn-in power line 4 is connected electrically to a probing pad 2. The probing pad 2 is connected electrically to internal circuitry (though not shown) of the chip through a bonding pad 7. A fuse 5 intervenes between the bonding pad 7 and the probing pad 2.

The burn-in testing of the wafer of the Japanese documentation is described hereinafter. The wafer is loaded into an oven having a selected temperature and atmosphere. Next, a burn-in voltage is applied to the burn-in power lines 4. By applying the burn-in voltage, there is electric current flowing into the chips 1. An electrical current, which is excessively large, flows into a defective chip. The excessive current makes the fuse 5 on the defective chip melt, thereby opening the fuse. That is to say, the defective chip is disconnected from the burn-in power line 4. If the defective chip were still connected to the burn-in power line 4 with the excessive current, the operating voltage would be decreased. According to the Japanese documentation, there is no decreasing in the burn-in voltage, because the defective chip is disconnected from the burn-in power line 4. Therefore, the burn-in testing can be performed under a stable condition for the other good chips. After the burn-in testing, the good chips are subject to subsequent manufacturing processes including a packaging process.

According to the Japanese documentation, the fuse of the defective chip is opened, while the fuse of the good chip remained not opened. The inventor of the present invention found that the probing pad, which is connected to the bonding pad in the good chip through the not-opened fuse, induces increased parasitic capacitance and parasitic resistance. The increased parasitic capacitance and parasitic resistance may induce a speed delay in operation, even though the chip is packaged.

SUMMARY OF THE INVENTION

It is an object of the present invention to provide a semiconductor device, which has an enhanced performance including no delay in device operation.

Another object of the present invention is to provide a method for forming a semiconductor device, which is free from an affect of a parasitic capacitance and resistance induced by a probing pad.

According to one aspect of the present invention, a semiconductor device has a chip having an internal circuit. An opened fuse is formed on the chip. The opened fuse has two ends. An output pad is formed on the chip. The output pad has a first exposed portion. The output pad is connected to the one end of the opened fuse. A package has a output lead, which is connected to the output pad. The semiconductor device also has a probing pad. The probing pad has a second exposed portion and is connected to the other end of the opened fuse. Preferably, the opened fuse is located closer to the first exposed portion than the second exposed portion.

According to another aspect of the invention, a method of forming a semiconductor device comprises providing chips having a plurality of probing pads, a plurality of output pads and a plurality of fuses. Each of the plurality of probing pads is connected to each of the plurality of output pads though each of the plurality of fuses. The chips are electrically tested by a plurality of probing tips to identify a portion of the chips including good chips and repairable chips. All fuses, which are in the good chips and the repairable chips, are cut. A package having a plurality of output leads is provided. Each of the output leads is electrically connected to each of the output pads. The cutting is performed by a laser beam.

According to another aspect of the invention, a method of forming a semiconductor device comprises providing a wafer. A first layer is formed on the wafer. A second layer is formed on the first layer. The second layer is patterned to expose a portion of the first layer and to form a probing pad and an output pad. The probing pad is electrically connected to the output pad through the exposed portion of the first layer. Electrical testing of the wafer is performed by using the probing pad. A laser beam cuts the exposed portion of the first layer.

Accordingly, it is possible to significantly reduce the affect of a parasitic capacitance and a parasitic resistance on performance of the device.

BRIEF DESCRIPTION OF THE DRAWINGS

Other features of the present invention will be more readily understood from the following detail description of specific embodiment thereof when read in conjunction with the accompanying drawings, in which.

DESCRIPTION OF THE PREFERRED EMBODIMENT

Preferred embodiments of the present invention will be described hereinafter with reference to the accompanying drawings, even though the scope of the present invention is not limited to the embodiments.

Figure 2:
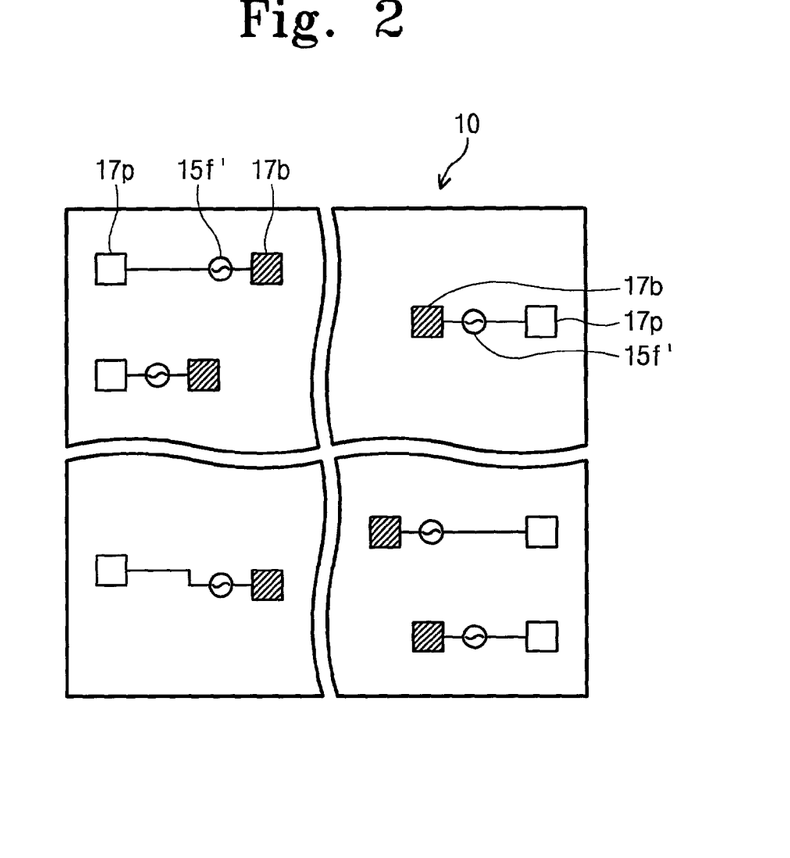
FIG. 2 is a plan view illustrating a semiconductor device according to a present invention.

FIG. 2 is a schematic plan view illustrating a semiconductor device according to the present invention.

Referring to FIG. 2, a semiconductor chip 10 of the semiconductor device has a plurality of probing pads 17p thereon. The plurality of probing pads 17p is formed on a peripheral area, i.e., close to the edge of the chip 10 in order to make it easy to arrange probing tips of a probing card. The probing card is used for subsequent electrical testing of the device.

The chip 10 has also a plurality of output pads 17b thereon. The output pads 17b are electrically connected to output leads of a package of the device such as balls, though not shown. The output pads 17b are formed irregularly on the chip 10. In detail, the output pads 17b are located adjacent to selected internal circuits of the chip 10 like as an input/output circuit, a power source line, a ground line and a control circuit. Preferably, the output pads 17b may be located at a central portion of the chip 10 as described in the figure. That is to say, the output pads 17b may be formed not at the peripheral area. Such an arrangement of the output pads 17b reduces a connection length between the output pads 17b and the selected internal circuits, thereby substantially reducing a parasitic capacitance and a parasitic resistance therebetween. Therefore, the performance of the device becomes enhanced.

The chip 10 has also a plurality of opened fuses 15f. Each of the opened fuses 15f has one end electrically connected to selected one of the output pads 17b and the other end connected to selected one of the probing pads 17p. Each of the opened fuse s 15f electrically disconnects the selected one of the output pads 17b from the selected one of the probing pads 17p. Preferably, each of the opened fuse 15f may be located more closely to an exposed portion of the selected one of the output pads 17b than to an exposed portion of the selected one of the probing pads 17p. Such an arrangement of the opened fuses 15f reduces a connection length between the output pads 17b and the opened fuses 15f, thereby substantially reducing a parasitic capacitance and a parasitic resistance therebetween.

The semiconductor device also has packaging elements.

In this embodiment, a flip chip type package is used, though not shown. But, the present invention is not limited to this embodiment. Other kinds of packages may be used in virtue of the present invention. For example, bumps may be replaced by conductive wires. That is to say, a plurality of conductive bumps having a rounded shape each is formed on each of the output pads 17b. A plurality of under-bump metal patterns may be formed between each of the conductive bumps and each of the output pads 17b. The under-bump metal patterns act as diffusion barriers, which prevent diffusions of metal atoms from the output pads 17b into the conductive bumps or from the conductive bumps into the output pads 17b. For better understanding and to simplify the drawing, other packaging elements are not described in this embodiment.

According to the semiconductor device of the present invention, each of the opened fuse 15f electrically disconnect the output pads 17b from the probing pads 17p. And, each of the opened fuse 15f may locate more closely to the exposed portion of the selected one of the output pads 17b than to the exposed portion of the selected one of the probing pads 17p. In addition, the output pads 17b are preferably located adjacent to the selected internal circuits of the chip 10. Therefore, it is possible to significantly reduce the effect of a parasitic capacitance and a parasitic resistance on performance of the device.

FIGS. 3 to 10 are cross sectional views illustrating successive process steps for forming the semiconductor device described above. For better understanding, the drawings show only a portion of a semiconductor wafer. That is to say, the drawings show only one fuse, one probing pad and one output pad. However, a plurality of fuses, a plurality of probing pads and a plurality of output pads may be formed on a chip area of the semiconductor wafer.

Figure 3:
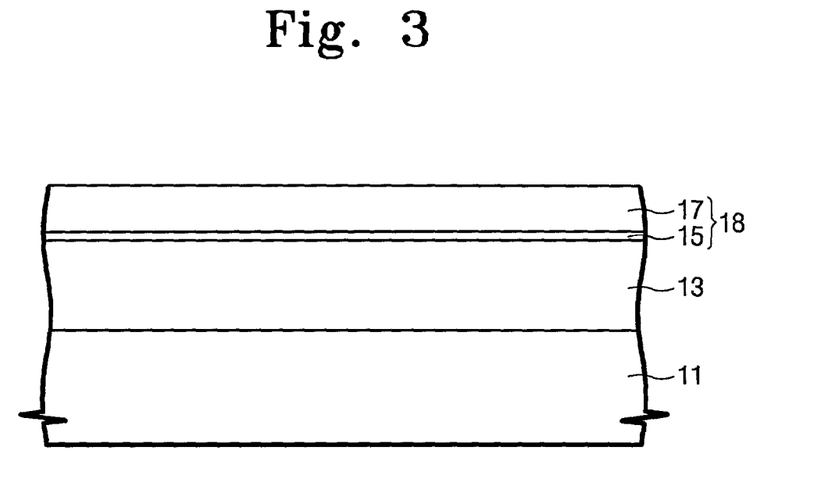
FIGS. 3 to 10 are cross sectional views illustrating successive process steps for forming a semiconductor device according to a present invention.

Referring to FIG. 3, an insulating layer 13 is formed on a semiconductor wafer 11. A metal layer 18 is formed on the insulating layer 13. The metal layer 18 is formed preferably by sequentially stacking a barrier metal layer 15 and a pad metal layer 17. The barrier metal layer 15 is a titanium nitride layer. The pad metal layer 17 is an aluminum layer or an aluminum alloy layer. Before the formation of the barrier metal layer 15, an ohmic metal layer like a titanium layer may be formed on the insulating layer 13.

Figure 4:
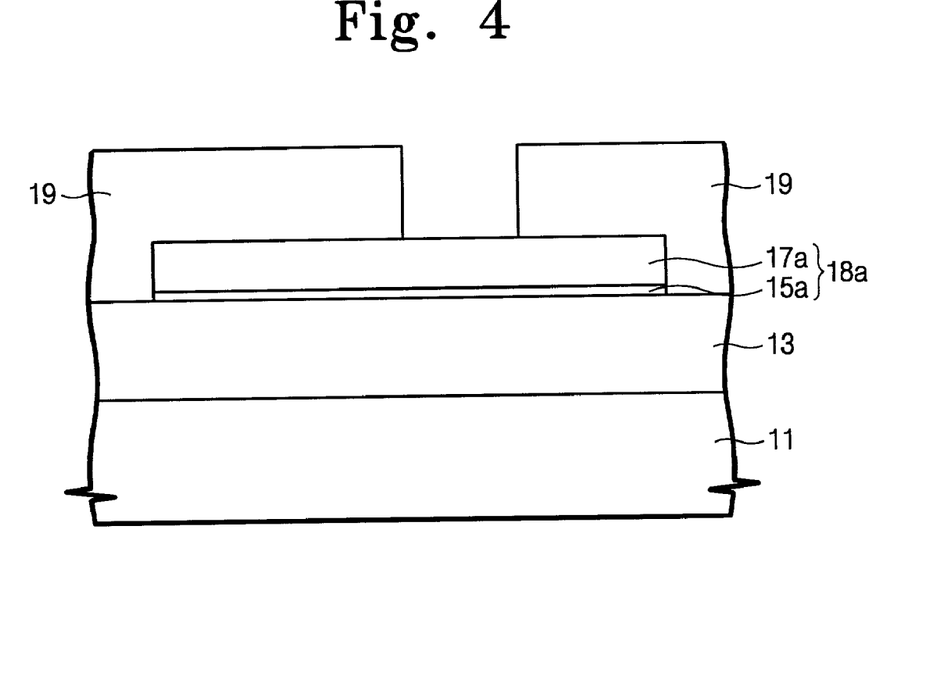

Referring to FIG. 4, the metal layer 18 is patterned to form a metal pattern 18a on a selected area of the insulating layer 13 of a chip area. The metal pattern 18a comprises a barrier metal pattern 15a and a pad metal pattern 17a, which are continuously stacked on the insulating layer 13. On a resultant structure having the metal pattern 18a, a first photoresist pattern 19 is formed to expose a portion of the pad metal pattern 17a.

Figure 5:
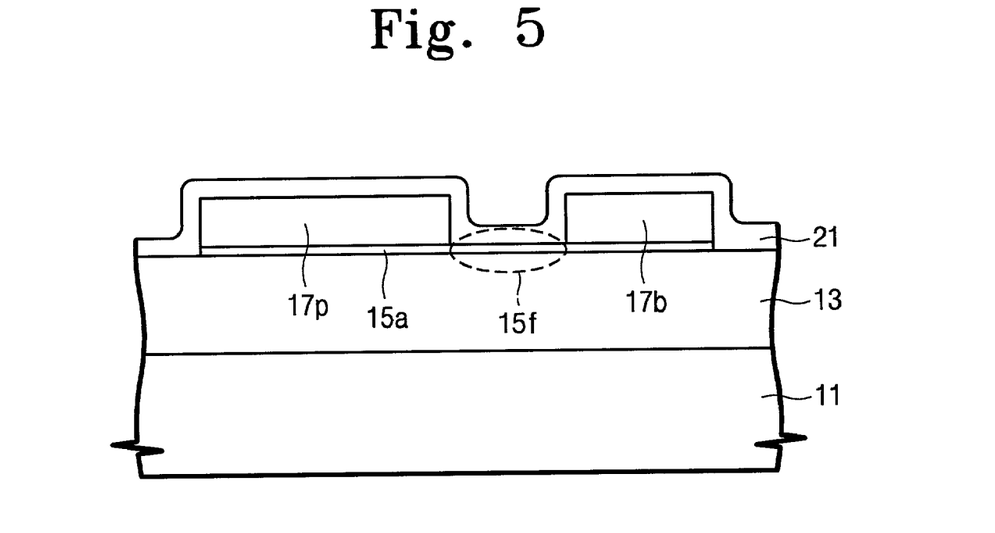

Referring to FIG. 5, the exposed portion of the pad metal pattern 17a is selectively etched using the first photoresist pattern 19 as an etching mask to expose a portion of the barrier metal pattern 15a, thereby forming a probing pad 17p and an output pad 17b. The probing pad 17p and the output pad 17b are separated from each other, but electrically connected to each other through the exposed portion of the barrier metal pattern 15a. The exposed portion of the barrier metal pattern 15a is a fuse 15f.

The probing pad 17p is formed on a peripheral area of the chip area. A probing card has a plurality of probing tips. One of the tips physically and electrically contacts a corresponding probing pad 17p during a subsequent electrical testing. Therefore, the arrangement of probing pads 17p on the peripheral area is helpful for providing simple arrangement of the tips in the probing card. The output 17b is arranged irregularly on the chip area. In detail, the output pad 17b is located adjacent to internal circuits like as an input/output circuit, a power source line, a ground line and a control circuit. Preferably, the output 17b may be formed at the central portion, not on the peripheral area. This arrangement of the output pad 17b reduces parasitic capacitance and parasitic resistance between the output pad 17b and the internal circuits, thereby enhancing the performance of the device.

After formation of the fuse 15f, the first photoresist pattern 19 is removed. On a resultant structure having the output 17b and the probing pad 17p, a passivation layer 21 is formed to protect the chip area. The passivation layer 21 comprises a silicon nitride layer.

Figure 6:
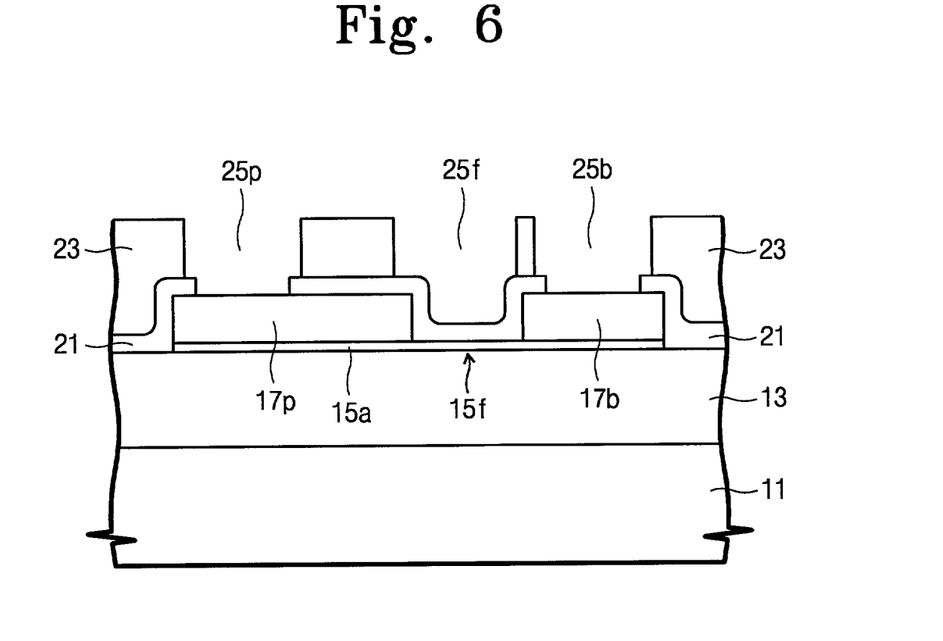

Referring to FIG. 6, the passivation layer 21 is patterned to expose a portion of the output pad 17b and a portion of the probing pad 17p. Preferably, a distance between the fuse 15f and the exposed portion of the output pad 17b is shorter than a distance between the fuse 15f and the exposed portion of the probing pad 17p. That is to say, the fuse 15f is preferably formed closely to the exposed portion of the output pad 17b.

A polyimide layer 23 is formed on the resultant structure. The polyimide layer 23 acts as a buffer layer to protect the chip area from an epoxy-molding compound during a subsequent packaging process. In addition, the polyimide layer 23 substantially prevents alpha particles from penetrating into the chip area. The polyimide layer 23 is patterned to form a probing pad opening 25p, a fuse opening 25f and an output pad opening 25b. The probing pad opening 25p exposes the exposed portion of the probing pad 17p. The fuse opening 25f exposes a portion of the passivation layer 21 on the fuse 15f. The output pad opening 25b exposes the exposed portion of the output pad 17b.

Figure 7:
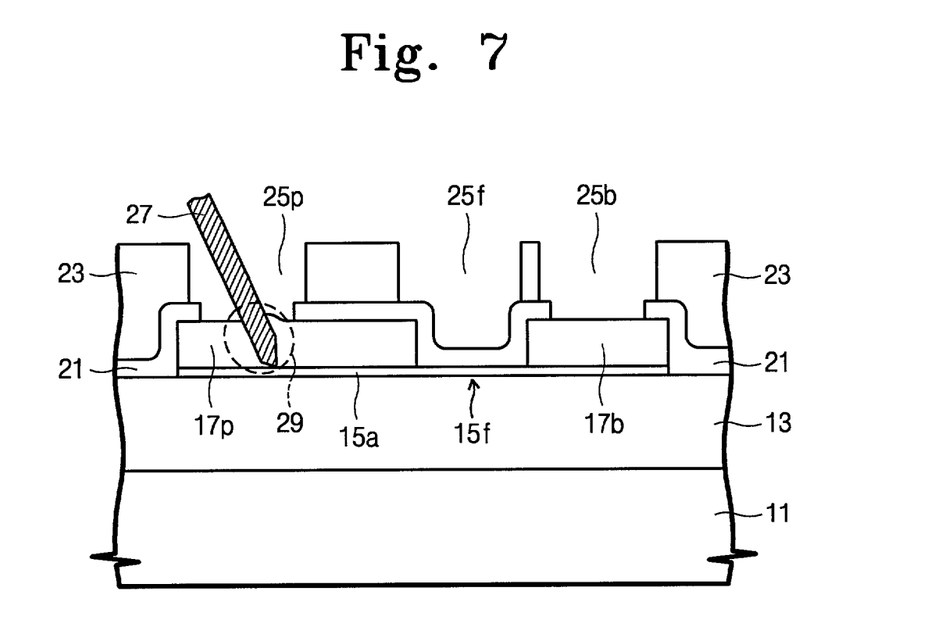

Referring to FIG. 7, the electrical testing, which is briefly described above, is performed for the resultant structure of FIG. 6. The electrical testing comprises physically and electrically contacting the probing tip 27, which is briefly described above, onto the exposed portion of the probing pad 17p. The probing tip 27 is connected to a set of testing equipment. Electrical input signals are applied into the chip from the testing equipment through the probing tip 27, the fuse 15f and output pad 17b. The testing equipment measures electrical output signals from the chip through the probing tip 27, the fuse 15f and output pad 17b. With the testing process, it is determined whether the chip is defective or not. If the chip is defective, no subsequent manufacturing process is needed. If the chip is not defective or repairable, subsequent manufacturing process is performed described bellow. If the chip is repairable, the chip may be repaired by a well-known repairing process in a subsequent process step.

The probing tip 27 induces physical damage 29 on the probing pad 17p, because the probing tip 27 physically contacts the probing pad 17p. If this damage were formed on the output pad 17, there would be a problem during a subsequent process step. That is to say, there would be weak adhesiveness of a wire or a bump during the subsequent packaging process. As a result, reliability of the device would become degraded. However, in the present invention, there is only damage on the probing pad 17p, but no damage on the output pad 17b on which the wire or the bump is to be connected or formed in a subsequent process step.

Figure 8:
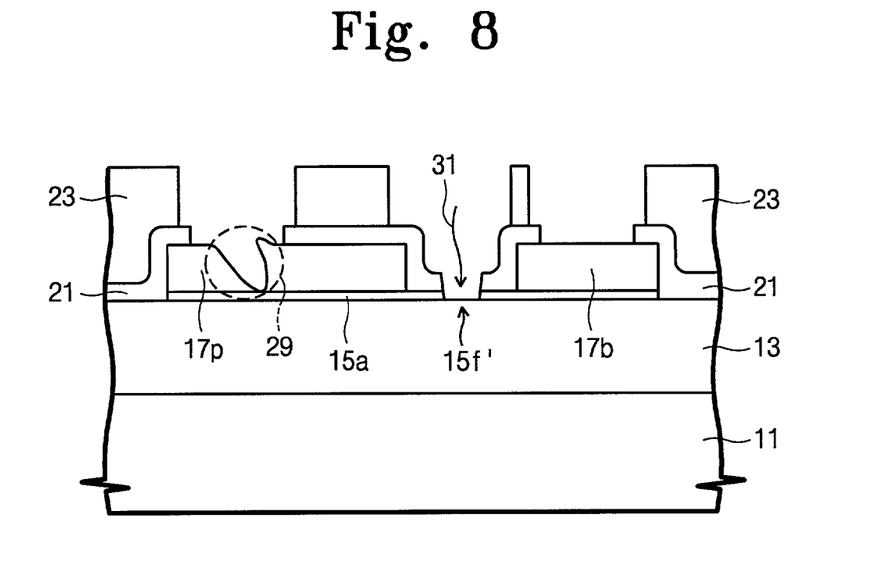

Referring to FIG. 8, the fuse 15f is cut by laser beam 31, thereby forming an opened fuse 15f'. That is to say, the probing pad 17p and the bump pad 17p are electrically disconnected from each other. In case that a plurality of fuses is formed on the chip as described above, all of the fuses 15f of the chip are completely cut. Therefore, the device is free from the effect of a parasitic capacitance and a parasitic resistance induces by the probing pads 17p. The fuse 15f may be cut during the repairing process for the repairable chip.

Next, the packaging process is performed as described below. In this embodiment, a flip chip type packaging process is used. But, the present invention is not limited to this embodiment. Other kinds of packaging processes may be used in virtue of the present invention. For example, bumps may be replaced by conductive wires.

Figure 9:
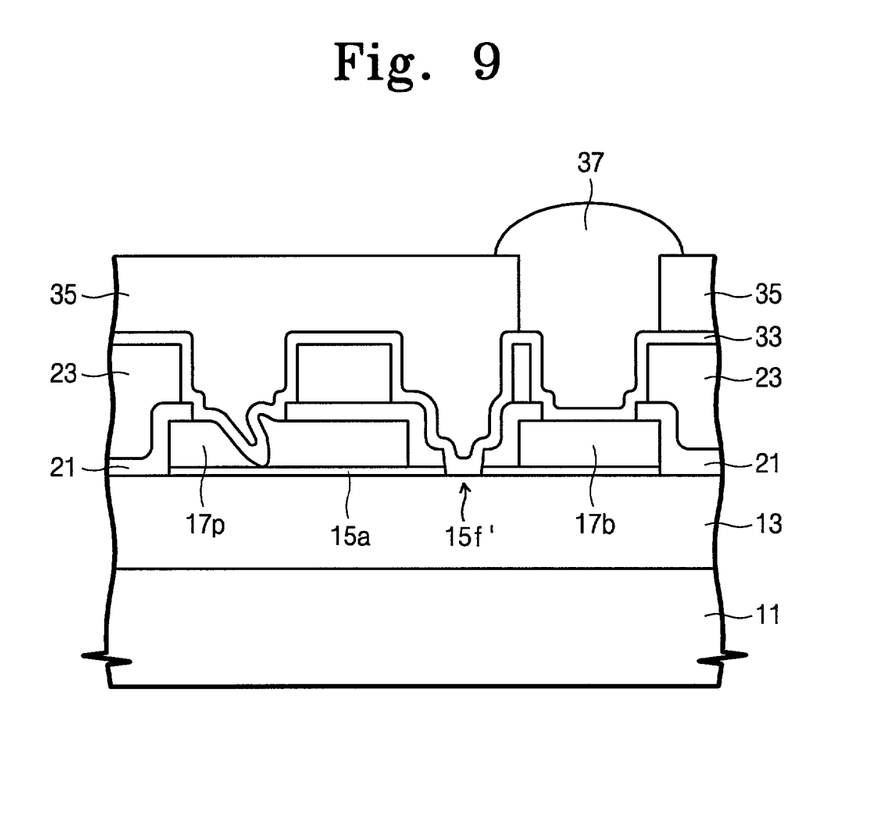

Referring to FIG. 9, an under bump metal layer 33 is formed by a well-known method on the resultant structure. The forming of the under bump metal layer 33 is preformed by sequentially stacking a wetting layer and a diffusion barrier layer. On the under bump metal layer 33, a second photoresist pattern 35 is formed to expose a portion of the under bump layer 33, which is located on the bump pad 17b. On the exposed under bump layer 33, a bump pattern 37 is selectively formed by an electroplating method. The material of the bump pattern 37 is an alloy layer of Pb and Sn.

Figure 10:
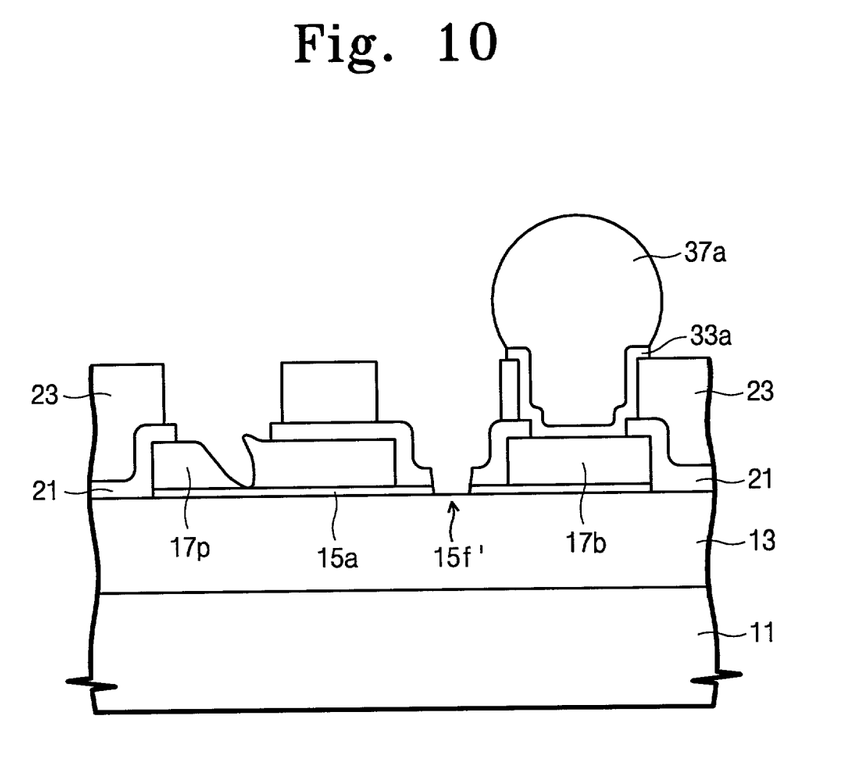

Referring to FIG. 10, the second photoresist pattern 35 is removed. A portion of the under bump metal layer 33 is etched using the bump as an etching mask. The portion of the under bump metal layer 33 is etched preferably by wet etching. As a result, an under bump metal pattern 33a is formed, intervening between the bump pad 17b and the bump pattern 37. Next, the bump pattern 37 is subject to a reflowing under a selected temperature, thereby forming a bump 37a having a rounded shape. During the reflowing step, the under bump metal pattern 33a prevents the bump 37a and the bump pad 17b from react with etch other by inter-diffusions.

Continuously, subsequent steps of the flip chip type packaging process are completed as well known in the art. And then, a final package testing is performed to check whether the packaging process is properly performed and to classify into a good device or a defective device.

Though only one chip is formed on the wafer in this embodiment, a plurality of chips may be formed on the wafer with a plurality of scribe lanes between the chips. The plurality of the chips is separated by cutting along with the scribe lanes, after the reflowing step.

According to the present invention, the probing pad 17p is electrically disconnected from the output pad 17b. And the opened fuse 15f' may be located more closely to the exposed portion of the output pad 17b than to the exposed portion of the probing pad 17p. In addition, the output pad 17b is preferably located adjacent to the selected internal circuits. Therefore, it is possible to significantly reduce the effect of a parasitic capacitance and a parasitic resistance on performance of the device.

In the drawings and specification, there have been disclosed typical preferred embodiments of the invention and, although specific terms are employed, they are used in a generic and descriptive sense only and not for purpose of limitation, the scope of the invention being set forth in the following claims:

What is claimed is:

1. A semiconductor chip comprising:
    an internal circuit, the internal circuit having been determined to be non-defective by passing an electrical test;
    a metal pattern disposed on the chip, the metal pattern including an output pad portion that is electrically connected to the internal circuit and a probing pad portion that is electrically isolated from the internal circuit and the output pad by a gap in the metal pattern, the gap constituting an opened fuse portion of the metal pattern,
    the output pad having a first exposed portion and the probing pad having a second exposed portion, the first exposed portion located closer to the opened fuse than the second exposed portion.

2. The semiconductor device of claim 1, wherein the output pad is located at a central portion of the chip.

3. The semiconductor device of claim 1, wherein the chip has an internal circuit located adjacent to the output pad and the internal circuit is a circuit selected from the group consisting of an inputloutput circuit, a power source line, a ground line and a control circuit.

4. The semiconductor device of claim 1, wherein the probing pad is located at a peripheral area of the chip.

5. The semiconductor device of claim 1, the metal pattern including a barrier metal layer pattern that is common to the output pad portion, the probing pad portion, and the opened fuse portion of the metal pattern.

6. The semiconductor device of claim 5, the barrier metal layer pattern comprising a titanium nitride layer.

* * * * *